(12) United States Patent
Britton

(10) Patent No.: US 7,329,336 B2
(45) Date of Patent: Feb. 12, 2008

(54) STABILIZER WITH CATHODIC PROTECTION

(75) Inventor: Jim Britton, Houston, TX (US)

(73) Assignee: Deepwater Corrosion Services, Inc., Houston, TX (US)

( * ) Notice: Subject to any disclaimer, the term of this patent is extended or adjusted under 35 U.S.C. 154(b) by 105 days.

(21) Appl. No.: 11/407,503

(22) Filed: Apr. 20, 2006

(65) Prior Publication Data

US 2007/0246348 A1    Oct. 25, 2007

(51) Int. Cl.
C23F 13/16 (2006.01)
(52) U.S. Cl. .................. 205/734; 205/730; 205/731; 205/732; 205/733; 205/740; 204/196.17; 204/196.18; 204/196.19; 204/196.2; 204/196.3; 204/196.33; 204/196.34; 204/196.37
(58) Field of Classification Search ........... 204/196.17, 204/196.18, 196.19, 196.2, 196.3, 196.33, 204/196.34, 196.37; 205/730, 731, 732, 205/733, 734, 740
See application file for complete search history.

(56) References Cited

U.S. PATENT DOCUMENTS

| | | | |
|---|---|---|---|
| 4,705,331 A | 11/1987 | Britton | |
| 5,289,561 A | 2/1994 | Costa Filho | |
| 5,458,441 A | 10/1995 | Barry | |
| 5,722,795 A | 3/1998 | Angel et al. | |
| 5,944,449 A | 8/1999 | Angel et al. | |
| 5,975,796 A | 11/1999 | Angel et al. | |
| 6,027,285 A | 2/2000 | Angel et al. | |
| 6,106,194 A | 8/2000 | Angel et al. | |
| 6,106,741 A * | 8/2000 | Heimann et al. | ........ 252/389.3 |
| 6,142,707 A | 11/2000 | Bass et al. | |
| 6,171,025 B1 | 1/2001 | Langner et al. | |
| 6,179,523 B1 | 1/2001 | Langner et al. | |
| 6,257,800 B1 * | 7/2001 | Masters | ...................... 405/224 |
| 6,264,401 B1 | 7/2001 | Langner et al. | |
| 6,315,497 B1 | 11/2001 | Wittman et al. | |
| 6,416,253 B1 | 7/2002 | Wimp et al. | |
| 6,461,082 B1 | 10/2002 | Smith | |
| 6,726,831 B2 | 4/2004 | Bass et al. | |
| 6,788,075 B2 | 9/2004 | Hudson | |
| 6,835,291 B2 | 12/2004 | Hudson | |

* cited by examiner

*Primary Examiner*—Bruce F. Bell
(74) *Attorney, Agent, or Firm*—Jennifer S. Sicker; Gardere Wynne Sewell LLP

(57) ABSTRACT

A cathodic protection system for protecting an underwater structure includes a plurality of blocks which are capable of conforming to various structures. Each of the blocks include:
  a flexible wire rope, the rope constructed and arranged to pass through the center of each block in two directions, and embedded therein to fasten the blocks to each other by rows and columns;
  a sacrificial anode embedded in at least one of the blocks, and electrically attached inside the block to the flexible wire rope; and
  a connecting system electrically attached to the wire rope and to the underwater structure.

Each block has a non-abrasive pad attached to it. The pad provides spacing between the block and the underwater structure. The system includes means for collecting performance data from the system. The sacrificial anode is made of a composition taken from the group comprising alloys of: zinc, aluminum, or magnesium.

14 Claims, 5 Drawing Sheets

STABILIZER WITH CATHODIC PROTECTION

CROSS-REFERENCES TO RELATED APPLICATIONS

None.

STATEMENT REGARDING FEDERALLY SPONSORED RESEARCH OR DEVELOPMENT

None.

REFERENCE TO A "SEQUENTIAL LISTING"

None.

BACKGROUND OF THE INVENTION (1) Field of the Invention

The invention relates to subsea mats used to protect underwater structures from detrimental physical forces, and cathodic protection systems used to protect underwater structures from detrimental electrical forces.

(2) Description of the Related Art

Various types of subsea mats exist for protecting subsea pipelines. These are disclosed in at least the following patents:

| Patent | Title |
| --- | --- |
| 6,416,253 | Abrasive resistant open cell articulated seabed mat |
| 6,106,194 | Placement device for underwater mats and method |
| 6,027,285 | Mat installation |
| 5,975,796 | Vertical flow diversion mat system |
| 5,944,449 | Non-Abrasive subsea mat |
| 5,846,023 | Non-abrasive subsea mat |
| 5,722,795 | Non-abrasive subsea mat |

None of these patents disclose active cathodic protection using anodes. Various systems for corrosion protection of subsea structures exist. These are disclosed in at least the following patents:

| Patent | Title |
| --- | --- |
| 6,835,291 | Anode monitoring and subsea pipeline power transmission |
| 6,788,075 | Anode monitoring |
| 6,726,831 | Corrosion protection of electrically heated pipe-in-pipe subsea pipeline |
| 6,461,082 | Anode system and method for offshore cathodic protection |
| 6,315,497 | Joint for applying current across a pipe-in-pipe system |
| 6,264,401 | Method for enhancing the flow of heavy crudes through subsea pipelines |
| 6,179,523 | Method for pipeline installation |
| 6,171,025 | Method for pipeline leak detection |
| 6,142,707 | Direct electric pipeline heating |
| 5,458,441 | Pipe section for installation into a subsea pipeline |
| 5,289,561 | Subsea pipeline system with electrically heated flexible pipeline |
| 4,705,331 | Subsea connecting apparatus |

U.S. Pat. No. 6,461,082, listed above, discloses a long pipe ("anode carrier") with conventional anodes attached along its topside. This invention, however, requires additional supporting structure on the ocean floor for the pipe: "The anode carrier is therefore preferably placed on some type of support system, such as a 'mud mat' or other latticework, or some type of pipe rack, to prevent the pipe from sinking into the mud." (Column 4, lines 55-58) This "anode carrier" pipe most likely also needs stabilization mats. U.S. Pat. Nos. 4,484,839 and 4,484,840 disclose anode piles. The use of anode piles requires pile guides, to physically hold the anode piles against the platform. Not all platforms have existing pile guides that are available for this use.

U.S. Pat. No. 4,609,307 discloses anode sleds. The anodes are attached to sleds or pods that are placed on the ocean bottom and electrically connected to the structure or pipeline. However, fabrication and installation practices place practical limitations on the physical size of the sleds. This size restriction limits the number of anodes that can be attached and the spacing of anodes on the sled. When anodes are placed too close to each other on the sled, the anodes will start to electrically interfere with each other, thereby limiting the amount of electrical current that each sled can produce. On a large, deepwater structure, many sleds may be required to produce the desired amount of electrical current. The physical space around the structure available for such use may limit the number of sleds that can be installed, hence making this approach impractical.

BRIEF SUMMARY OF THE INVENTION

A cathodic protection system for protecting an underwater structure, comprising a plurality of blocks which are capable of conforming to various structures, each of the blocks comprising:

a flexible wire rope, the rope constructed and arranged to pass through the center of each block in two directions, and embedded therein to fasten the blocks to each other by rows and columns;

a sacrificial anode embedded in at least one of the blocks, and electrically attached inside the block to the flexible wire rope; and a connecting system electrically attached to the wire rope and to the underwater structure.

A method for cathodically protecting an underwater metallic structure, comprising the steps of:

(a) embedding a sacrificial anode in at least one of a plurality of blocks;

(b) electrically connecting each sacrificial anode by wire rope to form rows and columns of the plurality of blocks, to form a cathodic protection system;

(c) electrically connecting an electrical conductor to the cathodic protection system;

(d) placing the cathodic protection system in close proximity to the metallic structure; and (e) connecting the electrical conductor to the metallic structure.

DETAILED DESCRIPTION OF THE INVENTION

Figure 1:
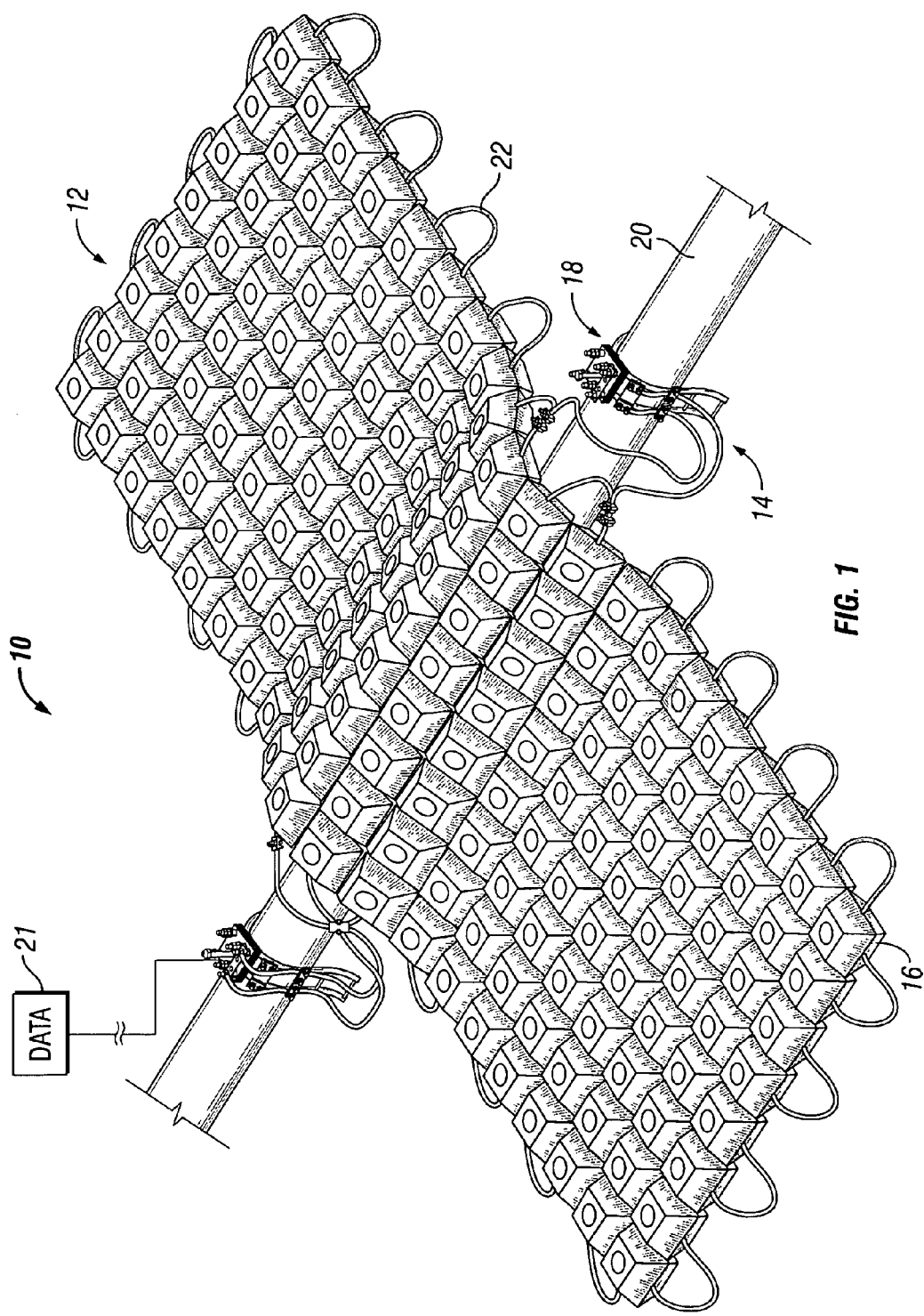
FIG. 1 is an isometric view of the cathodic protection stabilizer mat of the present invention, in place protecting an underwater pipe.

In FIG. 1, a cathodic protection stabilizer mat 10 includes a stabilizer mat 12 and a cathodic protection system 14. The stabilizer mat 12 is constructed substantially according to the mat disclosed in U.S. Pat. No. 5,944,449, which is incorporated herein by this reference. However, in an alternate embodiment, the stabilizer mat 12 can be built according to the mat disclosed in U.S. Pat. No. 6,416,253, which is incorporated herein by this reference. The stabilizer mat 12 includes individual concrete blocks 16. The cathodic protection system 14 includes a connecting system 18 which clamps to a pipe 20 or other subsea structure. The cathodic protection system 14 also includes a buoyant sun-station module 21, which is clamped to the pipe 20. The module 21 collects performance data from the cathodic protection system 14, including the current output of the stabilizer mat 12, and the structure-to-environment potentials measured on the pipe 20 both some distance away from the stabilizer mat 12, and directly underneath the stabilizer mat 12.

The cathodic protection system 14 also includes wire rope 22 which passes through each concrete block 16 and into the connecting system 18. The wire rope 22 is made of galvanized steel, and has a diameter of one-half to one inch, but in the preferred embodiment, the diameter is five-eighths inches.

Figure 2:
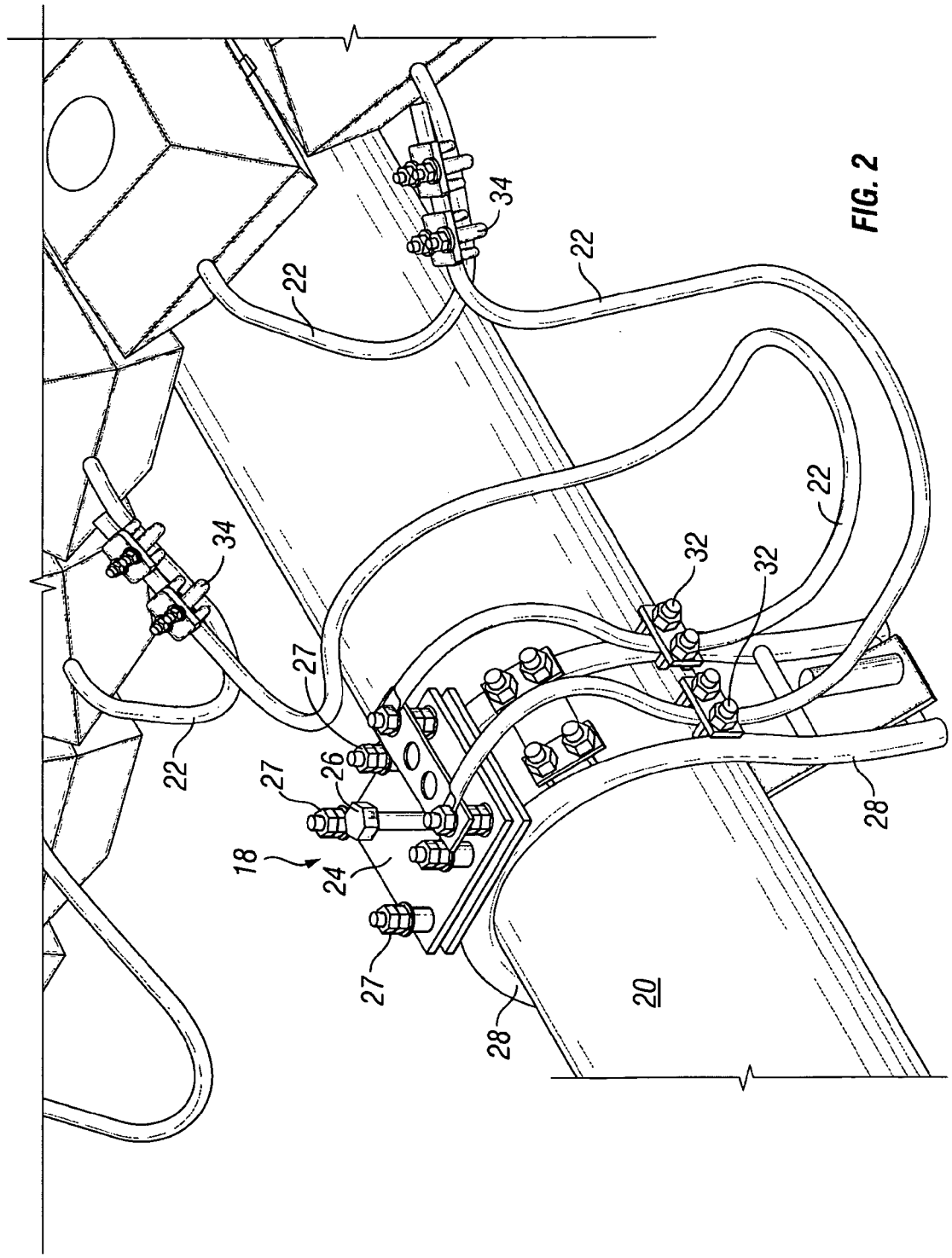
FIG. 2 is an isometric view of the connecting system that connects the cathodic protection stabilizer mat to the underwater pipe.

Referring now to FIG. 2, the connecting system 18 includes a pressure plate 24 having a pressure bolt 26 that exerts positive pressure by compression of four spring stacks 27 on the pipe 20 and on a double U-bolt 28 that engages the pipe 20. Connectors 30 connect the wire rope 22 to the pressure plate 24. The double U-bolt 28 includes clamps 32 that clamp the wire rope to the double U-bolt 28. Clamps 34 clamp short segments of the wire rope 22 to longer segments of the wire rope 22 that are embedded within the concrete blocks 16. However, in an alternate embodiment, the connecting system 18 could comprise either direct welding to the underwater structure, or an electro-mechanical fastener, including the use of explosively-installed, or friction-weld installed, metallic fasteners.

Figure 3:
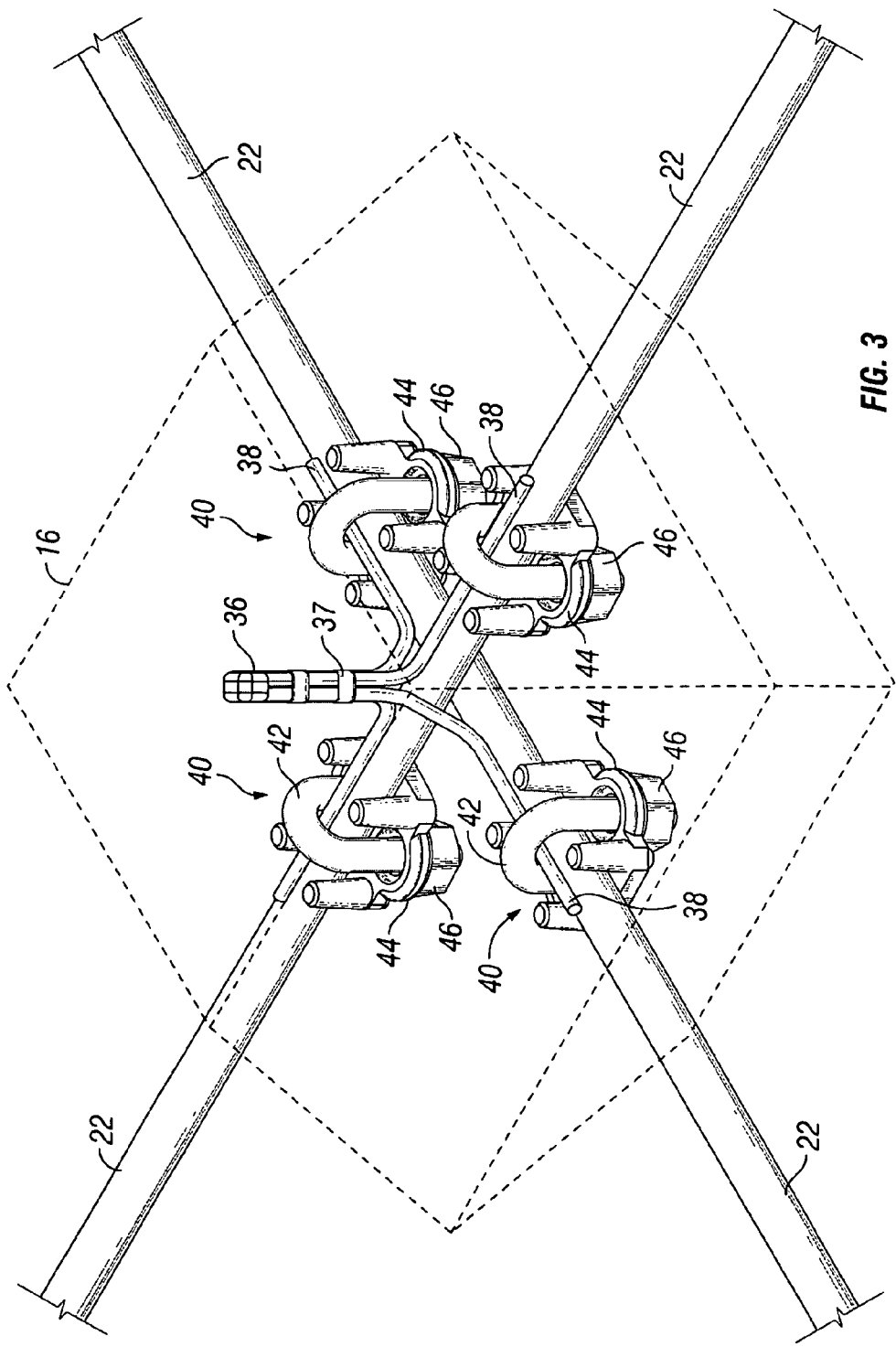
FIG. 3 is an isometric view of the core of a sacrificial anode attached to wire ropes within a concrete block of the cathodic protection stabilizer mat.

Referring now to FIG. 3, the internal structure of a concrete block includes two segments of the wire rope 22 that are clamped to a sacrificial anode core 36. The sacrificial anode core 36 has a vertical riser 37 and four legs 38. Each leg 38 is a solid rod, having a diameter of one-eighth to one-half inches, and a length of four inches. The four legs 38 are welded together to form the vertical riser 37. The sacrificial anode core 36 is galvanized steel or, in an alternate embodiment, any other electrical conductor. In an alternate embodiment, the sacrificial anode core 36 can be merely a length of wire rope, or can have merely two legs 38.

Figure 4:
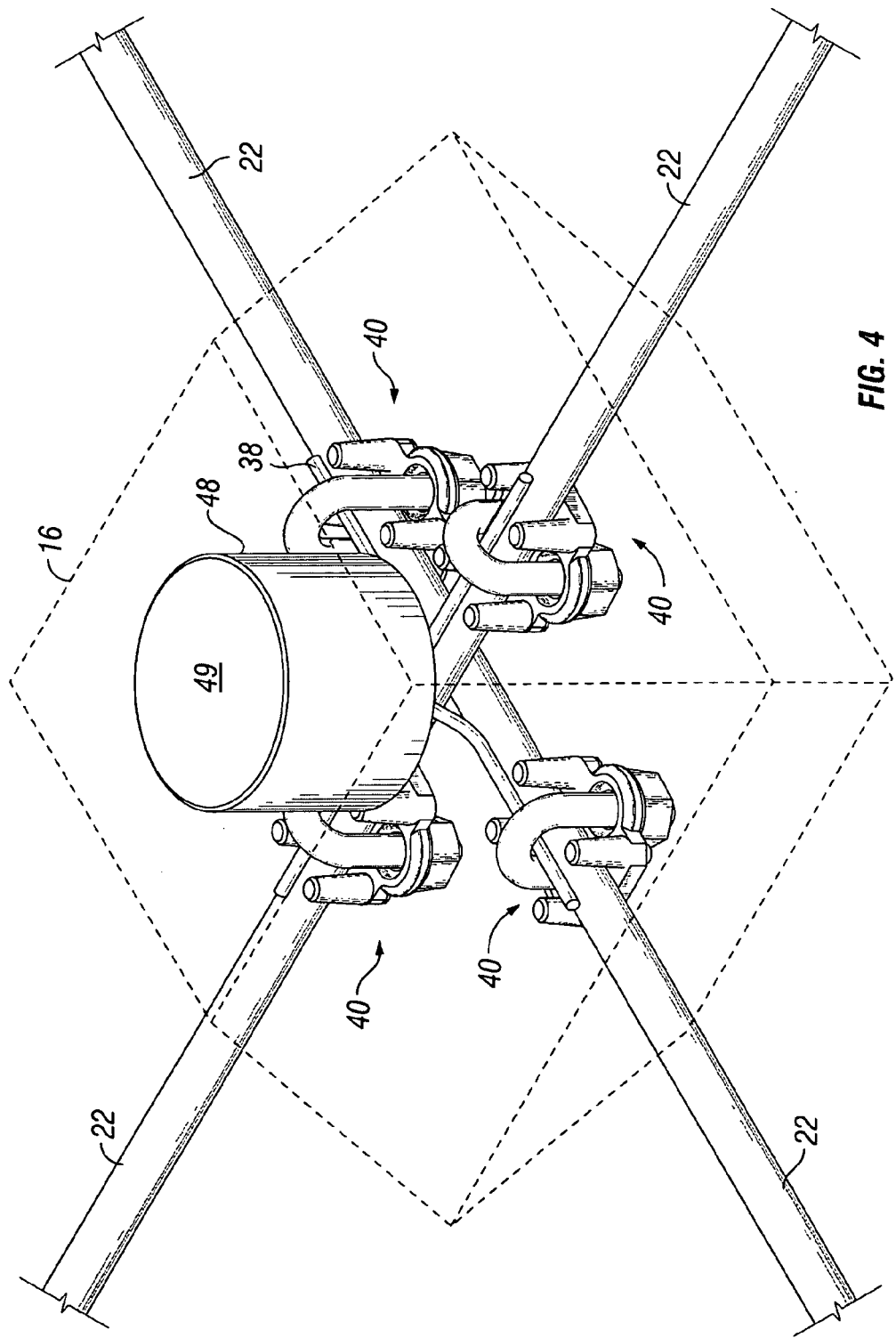
FIG. 4 is an isometric view of the sacrificial anode embedded within a concrete block of the cathodic protection stabilizer mat.
Figure 5:
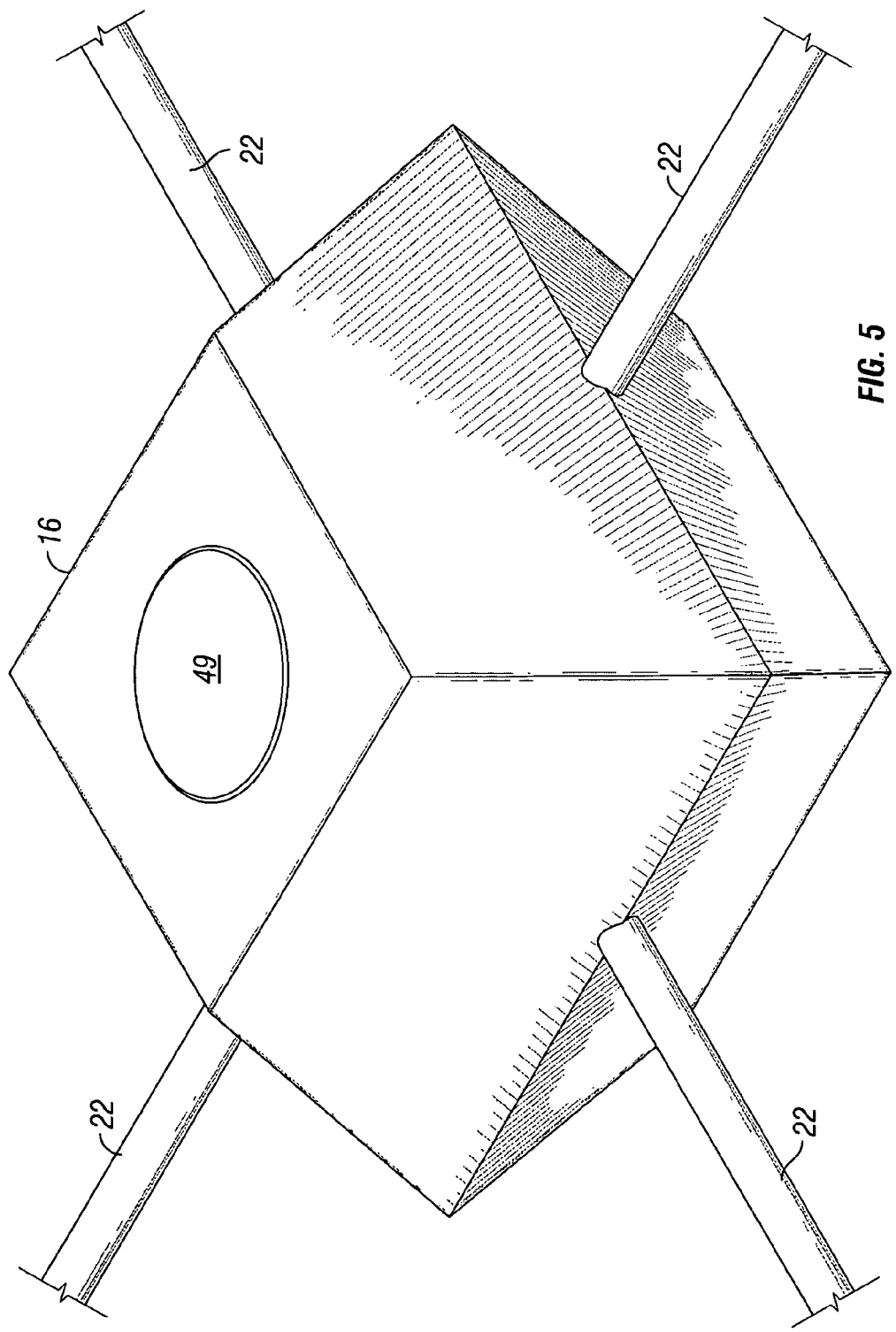
FIG. 5 is an isometric view of a concrete block with wire ropes protruding from it.

Referring now to both FIG. 3 and FIG. 4, the sacrificial anode core 36 is turned upside down, put into a mold, and then molten zinc is poured into the mold to form a sacrificial anode 48. However, in an alternate embodiment, the sacrificial anode 48 can be made of commercially available sacrificial anode alloys of zinc, aluminum, or magnesium. Although in the preferred embodiment the shape of the anode 48 is cylindrical, the shape could be any shape, including a cube or a bar. Referring now to FIG. 3 and FIG. 5, the sacrificial anode 48 is then connected to the wire rope with the leg clamps 40. Each leg 38 is clamped to a segment of the wire rope 22 by a leg clamp 40. Each leg clamp 40 includes a U-bolt 42, a pressure plate 44, and nuts 46, which is a standard wire rope clip. The sacrificial anode 48 is then encased in concrete to form the concrete bock 16, but leaving a top surface 49 of the sacrificial anode 48 exposed to the environment. Finally, a non-abrasive pad (not shown) is attached to the bottom of each block 16, in the manner disclosed by U.S. Pat. No. 5,944,449, where it discloses the pad 50 and the manner of its attachment, which disclosure is incorporated herein by this reference. Importantly, the pad does not electrically shield the cathodic protection stabilizer mat 10 from the pipe 20 or other structure that it is protecting, and does not impede the flow of electricity between the sacrificial anode 48 and the pipe 20.

In an alternate method of constructing the cathodic protection stabilizer mat 10, a stabilizer mat 12 is constructed having a through hole in each block 16, preferably orthogonal to the direction of the wire rope 22 that passes through each block 16. Then, for as many blocks as desired, the through hole is filled with molten zinc. In this method of construction, the wire rope that passes through each block 16 becomes the sacrificial anode core 36 for each block 16. The through holes in the remaining blocks are filled with concrete.

The amount of cathodic protection available depends on the amount of anode material in the cathodic protection stabilizer mat 10. Thus, for more protection, more blocks will contain a sacrificial anode. The factors that influence the number of blocks to contain a sacrificial anode are the amount of current needed to protect the structure, and the number of years of protection desired. The key variable in the amount of current that can be produced by the mat 10 is the electrical resistance of the mat 10 to the environment in which it is employed.

As one example, the sizing and selection of the anode material could follow the calculations disclosed in Column 6, line 8, through column 7, line 30, of U.S. Pat. No. 6,461,082, which is incorporated herein by this reference. As another example, the sizing and selection of the anode material could follow any industry standard currently in use.

The invention claimed is:

1. A cathodic protection system for protecting an underwater structure, comprising a plurality of blocks which are capable of conforming to various structures, each of the blocks comprising:
    a flexible wire rope, the rope constructed and arranged to pass through each block in two directions, and embedded therein to fasten the blocks to each other by rows and columns;
    a sacrificial anode embedded in at least one of the blocks, and electrically attached inside the block to the flexible wire rope; and
    a connecting system electrically attached to the wire rope and to the underwater structure.

2. The system according to claim 1, wherein at least one of the blocks has at least one separate non-abrasive and non-shielding pad attached to at least one surface of the block by at least one fastener embedded in the block, the pad providing spacing between the block and the underwater structure.

3. The system according to claim 1, wherein the blocks are arranged in substantially parallel rows and columns with sufficient space between each block to allow the blocks to conform to an uneven surface or to move flexibly.

4. The system according to claim 1, wherein the sacrificial anode includes a core comprising a vertical riser formed from four bent legs, wherein each leg is electrically and physically attached to the wire rope.

5. The system according to claim 1, further comprising means for collecting performance data from the system.

6. The system according to claim 1, wherein each block comprises concrete mixed with fillers prior to curing, wherein the fillers are selected from the group: fiberglass, fly ash, epoxy or mixtures thereof.

7. The system according to claim 1, wherein the pad is made of a composition taken from the group comprising: polyvinyl chloride, low-density polyethylene or mixtures thereof.

8. The system according to claim 1, wherein the wire rope is made of galvanized steel.

9. The system according to claim 1, wherein the sacrificial anode is made of a composition taken from the group comprising alloys of: zinc, aluminum, or magnesium.

10. A method for cathodically protecting an underwater metallic structure, comprising the steps of:
   (a) embedding a sacrificial anode in at least one of a plurality of blocks;
   (b) electrically connecting each sacrificial anode by wire rope to form rows and columns of the plurality of blocks, to form a cathodic protection system;
   (c) electrically connecting an electrical conductor to the cathodic protection system;
   (d) placing the cathodic protection system in close proximity to the metallic structure; and
   (e) connecting the electrical conductor to the metallic structure.

11. The method of claim 10, wherein each block comprises concrete mixed with fillers prior to curing, wherein the fillers are selected from the group: fiberglass, fly ash, epoxy or mixtures thereof.

12. The method of claim 10, further comprising the step of collecting performance data from the cathodic protection system.

13. The method of claim 10, wherein the step of embedding further comprises forming the sacrificial anode into a four-legged configuration from the group comprising alloys of: zinc, aluminum, or magnesium.

14. The method of claim 10, wherein the step of electrically connecting the sacrificial anode includes electrically attaching each leg of the sacrificial anode to the wire rope.

* * * * *